United States Patent
Terai

(10) Patent No.: US 8,692,309 B2
(45) Date of Patent: Apr. 8, 2014

(54) SEMICONDUCTOR DEVICE

(75) Inventor: Masayuki Terai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/559,859

(22) Filed: Jul. 27, 2012

(65) Prior Publication Data
US 2012/0286347 A1    Nov. 15, 2012

Related U.S. Application Data

(62) Division of application No. 12/519,685, filed as application No. PCT/JP2007/074258 on Dec. 17, 2007, now Pat. No. 8,278,701.

(30) Foreign Application Priority Data

Dec. 19, 2006   (JP) ................................ 20060340760

(51) Int. Cl.
*H01L 29/788*    (2006.01)
(52) U.S. Cl.
USPC .................. 257/316; 257/324; 257/E29.309; 257/E29.3; 257/326
(58) Field of Classification Search
None
See application file for complete search history.

(56) References Cited

U.S. PATENT DOCUMENTS

| | | | | |
|---|---|---|---|---|
| 7,811,886 | B2 * | 10/2010 | Winstead et al. | 438/261 |
| 7,872,298 | B2 * | 1/2011 | Shimamoto et al. | 257/320 |
| 2004/0232475 | A1 * | 11/2004 | Kataoka et al. | 257/315 |
| 2006/0022260 | A1 * | 2/2006 | Hisamoto et al. | 257/324 |
| 2008/0029805 | A1 * | 2/2008 | Shimamoto et al. | 257/315 |
| 2010/0025755 | A1 * | 2/2010 | Terai | 257/326 |

* cited by examiner

*Primary Examiner* — Mamadou Diallo
(74) *Attorney, Agent, or Firm* — Sughrue Mion, PLLC

(57) ABSTRACT

In the trap type memory chip the withstanding voltage is raised up, and then the electric current for reading out is increased. There are formed on the p-type semiconductor substrate 1 a first gate lamination structure which comprises a first insulating film 11 including a trap layer, and a first conductive body 9, and a second gate lamination structure which comprises a second insulating film 12 free of a trap layer and including an insulating film layer 13 doped with metal for controlling the work function at least on the upper layer, and a second conductive body 10. A source drain region 2 and a source drain region 3 are formed such that the first gate lamination structure and the second gate lamination structure are interleaved therebetween.
The effective work function of the second gate lamination structure is higher than that of the first gate lamination structure.

3 Claims, 13 Drawing Sheets

(a)

(b)

(c)

(d)

(e)

SEMICONDUCTOR DEVICE

REFERENCE TO RELATED APPLICATION

This is a divisional application of U.S. patent application Ser. No. 12/519,685 filed on Aug. 12, 2009 and claims the benefit of its priority.

FIELD OF THE INVENTION

The present invention relates to a semiconductor device and a manufacturing technology thereof, and more specifically relates to an effective technology applied to the semiconductor device with a rewritable and nonvolatile memory.

BACKGROUND OF THE INVENTION

In order to fully explain the level of the technology on the present invention at present, all explanations of patents, patent applications, Gazettes of patents and scientific papers cited or specified in the present application are incorporated into it by referring to them herein.

In the miniaturization of flash memory until the generation of 0.13 μm the main stream was to reduce the cell area using Floating Gate (FG) and to make the insulating film thinner. On the contrary, in the generation of 90 nm the trap type memory has been noticed, which makes use of the trap in the insulating film for the charge storage layer, because it has become difficult to make the insulating film thinner from a view point of securing the retention property.

As one of the trap type nonvolatile memory cells the patent literature 1 discloses a structure comprising first transistor sections including a charge storage layer for the information storage and second transistor sections for selecting a first transistor section. FIG. 1 shows a conventional structure disclosed in the patent literature 1 in which the structure comprises a MOS type of the first transistor section made of a insulating film 4 including a trap layer and a conductor 5 used for a memory conductive body, and another MOS type of the second transistor section consisting of a insulating film 7 and a conductor 8 used for a control conductive body, on a semiconductor substrate 1. In addition, the MOS is the collective term to a transistor of a field effect type with an insulating gate.

In addition, a structure with three layers consisting of a silicon oxide film, a silicon nitride film and a silicon oxide film is used for the insulating film 4 including the trap layer. Also, for the conductive body 5, silicon doped with n-type impurity is used. Also, for the insulating film 7 a silicon oxide film is used, and for the conductive body 8, silicon doped with n-type impurity is used.

The first transistor section and the second transistor section are separated by an insulating film 6 between electrodes. The first transistor section is used for the information storage, and the second transistor section is used for selecting the first transistor section. It is the feature in the conventional structure that the withstanding voltage of the second transistor section is lower than that of the first transistor section, namely the film thickness of the insulating film 4 including the trap layer is thinner than that of the insulating film 7. In the operation for reading data out, a stored data is read out on the bit line corresponding to whether or not electric current flows in accordance with the state of the threshold voltage in the first transistor section when the second transistor section with the nonvolatile memory cell is switched to ON state.

Since the second transistor section is thinner in the oxide film of the gate and smaller in the withstanding voltage than the first transistor section, it is possible to obtain relatively large trans-conductance (current drivability), using relatively lower gate voltage to the MOS transistor for selection, compared with the situation that both of the MOS transistor section for the memory retention and the MOS transistor for selection are formed with high withstanding voltages, thereby contributing to high speed in reading out. Herein, the lower the threshold voltage value in the first transistor section is set the more the electric current for reading out increases even at the lower voltage. However, it is necessary to be set at relatively higher level because the threshold voltage value in the second transistor section has a lower limit in view of suppression to the punch through electric current, namely the threshold voltage value in the second transistor section necessarily becomes more than the threshold voltage value in the first transistor section.

In the conventional structure setting of those threshold values have been implemented by adjusting impurity density in channel region 14 of the first transistor section and in channel region 15 of the second transistor section. Since the film thickness of the insulating film 7 is thinner than that of the insulating film 4 including the trap layer, the impurity density in the channel region 15 is necessary to be heightened, compared with the case that the film thickness of the insulating film 7 is thicker than that of the insulating film 4. There is a disadvantage that originally expected effect could not obtained, because the trans-conductance becomes lower even if the insulating film 7 is made thinner under the condition that the higher the impurity density becomes the more the impurity scattering of the carrier increases in the channel, and then the mobility becomes lower. Further, as the other problem in the conventional structure, there is a disadvantage that the electric current for reading out becomes lower by the occurrence of potential gaps between the channel regions because there is a gap between the first transistor section and the second transistor section.

In addition there is a disadvantage that it is impossible to implement common electrodes between the first transistor section and the second transistor section, because the second transistor section has a lower withstanding voltage and then the high voltage can not be applied thereto.

Patent literature 1: International publication WO2003/012878

DISCLOSURE OF THE INVENTION

Problem to be Solved by the Invention

The present invention is achieved under those circumstances mentioned above and the main object of the present invention is to solve the above problems.

Means for Solving the Problem

The semiconductor device according to the present invention is characterized in that the device comprises a first transistor section made of a first insulating film including a charge storage layer and a first conductive body, and at least a second transistor section made of a second insulating film free of a charge storage layer and a second conductive body, wherein the effective work function of the second transistor section is higher than that of the first transistor section.

Herein, the effective work functions do not indicate the work functions of the first conductive body material and the second conductive body material themselves. Instead, when the flat band voltage electrically measured in combination with respective insulating films and conductive bodies is defined as VFB, the effective work function is defined as eW and the work function of the silicon substrate is defined as φS, the effective work function is obtained from a formula, that is, eW=VFB+φS. In addition, it is preferable that the effective work function of the second transistor section is more than 4.2 eV and further preferable to be more than 4.6 eV.

The threshold value (VT) is expressed by the formula VT=VFB+2ΦB+(4∈Si q NaΦB)^(½)/Cox, when the difference between Fermi potential and true (intrinsic) potential in the silicon substrate is defined as channel density is defined as Na, Dielectric constant of silicon is defined as ∈Si and elementary charge is defined as q. In the semiconductor device according to the present invention, the threshold value of the second transistor section is higher even if the impurity densities are equal between the channel regions of the first transistor section and the second transistor section because the combination between the insulating film and the conductive body is selected so that the effective work function of the second transistor section is higher than that of the first transistor section. Further, when the effective work function of the second transistor section is more than 4.2 eV, the effective work function becomes higher than that of the conventional structure in which a silicon oxide film for the second insulating film and silicon doped with n-type impurity for the second conductive body are used. Accordingly, it is possible to obtain a target threshold value even when the impurity density is low in the channel region. When the impurity density is low in the channel region of the second transistor section, the component of impurity scattering of the carrier (electron) which flows in the channel region of the second transistor section is reduced and then the mobility rises up. Accordingly, it is possible to obtain a higher trans-conductance even when the second insulating film is thicker in the film thickness.

Also, as the secondary effect it is possible to reduce the influence due to the potential gaps occurred between the first transistor section and the second transistor section because the impurity density is reduced in the channel regions both of the first transistor section and the second transistor section. Therefore, it is possible to increase the electric current for reading out.

According to the semiconductor device of the present invention, it is not necessary to make the film thickness of the insulating film thinner. Namely, it is possible to realize that the first transistor section and the second transistor section have a common electrode because the whole withstanding voltage is not rate controlled by the withstanding voltage of the first transistor section.

In case that through developing the common electrode method, the boundary between the first transistor section and the second transistor section is deleted and then in one electrode a region including the trap layer in which the effective work function is relatively low and the other region free of the trap layer in which the effective work function is relatively high are formed, the gap is completely deleted between the first transistor section and the second transistor section, thereby further increasing the electric current for reading out.

Effect of the Invention

It is possible to realize a nonvolatile semiconductor memory device with high withstanding voltage and high electric current for reading out through utilizing the present invention.

Figure 1:
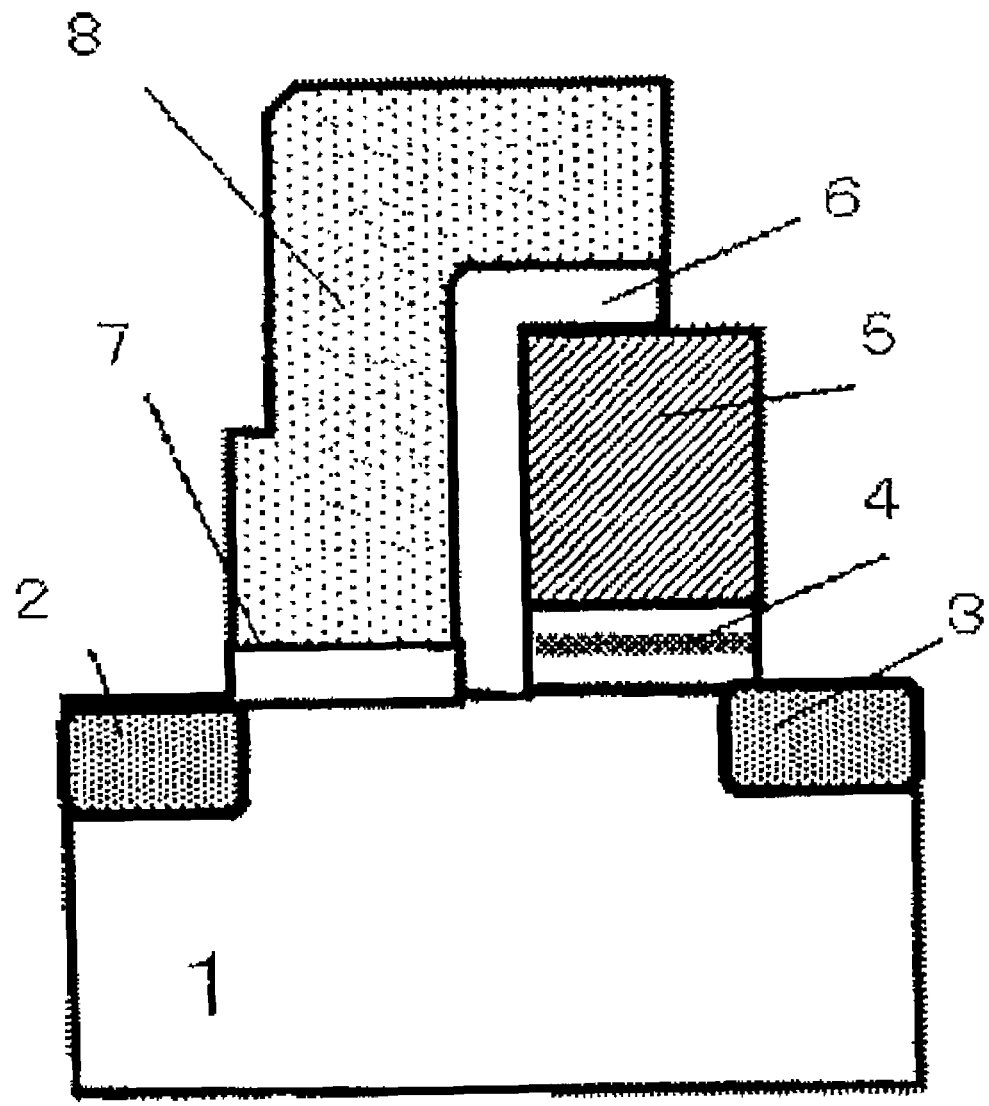
FIG. 1 is a sectional view of the conventional structure of the nonvolatile memory device.

DESCRIPTION OF NOTATION 1 semiconductor substrate
2 source drain
3 source drain
4 trap insulating film
5 memory conductive body (MG)
6 insulating film between electrodes
7 insulating film
8 control conductive body (CG)
9 first conductive body (silicon doped with n-type impurity)
10 second conductive body (silicon doped with n-type impurity)
11 first insulating film (free of trap layer)
12 second insulating film (including trap layer)
13 metal additive insulating film for controlling work function
15 silicon doped with n-type impurity
16 silicon doped with p-type impurity
17 insulating film with high dielectric constant
18 metal or metallic silicide layer for controlling work function in conductive body
19 metal or metallic silicide layer for controlling work function in conductive body
20 first region in conductive body
21 second region in conductive body
22 gap between electrodes

BEST MODE OF CARRYING OUT THE INVENTION

Herein below, preferable embodiments of the present invention will be explained in detail referring to the accompanied drawings wherein it is shown that such a trap type and nonvolatile semiconductor memory device with high current in reading out and excellent withstanding voltage can be put into practice.

<First Illustrative Embodiment

Referring to the drawings an embodiment of the present invention will be explained below.

Figure 2:
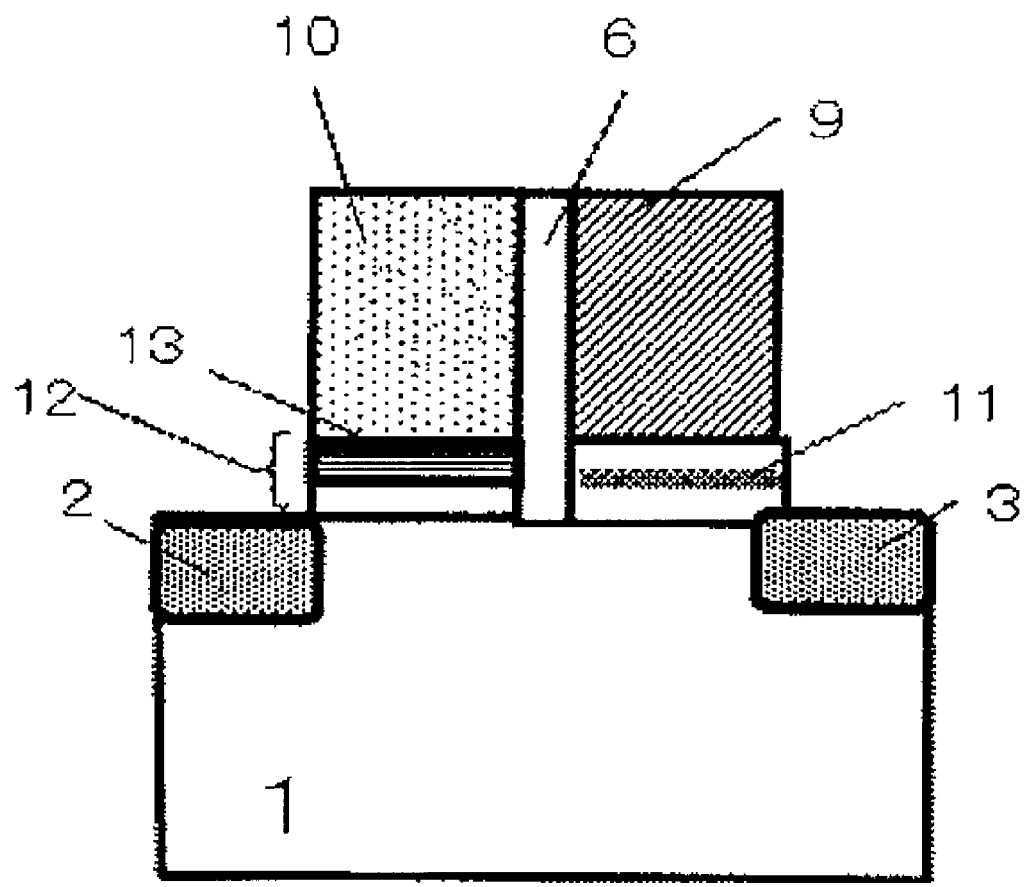
FIG. 2 is a sectional view of the nonvolatile memory device corresponding to a first illustrative embodiment according to the present invention.

FIG. 2 is a sectional view of the nonvolatile memory device corresponding to a first embodiment according to the present invention.

On a p-type semiconductor substrate 1 there are formed a first gate lamination structure and a second gate lamination structure. The first gate lamination structure comprises a first insulating film 11 including a trap layer and a first conductive body 9, and the second gate lamination structure comprises a second insulating film 12 free of a trap layer and a second conductive body 10. There are formed a source drain region 2 and a source drain region 3 interleaving the first gate lamination structure and the second gate lamination structure which become one memory cell together with both of the gate lamination structures.

Also, there is formed an interelectrode insulating film 6 between the first gate lamination structure and the second gate lamination structure.

In the source drain region 3 near to the charge storage layer it is preferable that the diffusion layer is deep in order to raise up electron injection efficiency using the hot electron, and in the source drain region 2 it is preferable that the diffusion layer is shallow in order to suppress the short channel effect in the memory cell. Therefore, it is preferable that the depth of the diffusion layer in the source drain region 3 is deeper than that of the diffusion layer in the source drain region 2. Also, in case that the abutting memory cells are arranged in the symmetry with regards to the source drain region 2 or the source drain region 3 such that a plurality of the cells are arranged on the memory regions regularly, it is possible to use the abutting source drains in common with each other, thereby effecting downsizing of the chip.

The feature of the present invention is in that the effective work function in the second gate lamination structure is higher than that in the first gate lamination structure. Preferably, the effective work function in the second gate lamination section is more than 4.2 eV, and still preferably, more than 4.6 eV. Herein, the effective work functions do not indicate the work functions of the first conductive body material and the second conductive body material themselves. Instead, when the flat band voltage electrically measured in combination of respective insulating films and conductive bodies is defined as VFB, the effective work function is defined as eW and the work function of the silicon substrate is defined as $\phi S$, the effective work function is obtained from a formula, that is, eW=VFB+$\phi$S. In addition, the effective work function of the first insulating film 11 including the trap layer corresponds to the value at the neutral state in which the second insulating film 12 does not store any charges.

In the embodiment of the present invention it is preferable to use silicon doped with n-type impurity for the first conductive body 9 and the second conductive body 10, and then to use the insulating film 13 doped with the metal to control work function for at least the top layer of the second insulating film 12. In detail, it is preferable that silicon oxide film or silicon oxynitride film doped with Hf or Al is used as the insulating film 13, and as the first insulating film 11 a structure comprising the first, the second and the third layers seeing from the side of the channel region is used, in which the first and third layers are made of silicon oxide or silicon oxynitride and the second layer is made of either one of silicon nitride, silicon oxynitride, alumina, hafnium silicate, hafnium oxide silicate, aluminum silicate and aluminum oxide silicate. Or, it is preferable that a silicon oxide film or a silicon oxynitride film doped with Hf or Al is used as the insulating film 13, and as the first insulating film 11 a structure comprising the first and the second layers seeing from the side of the channel region is used, in which the first layer is made of silicon oxide or silicon oxynitride and the second layer is made of either one of silicon nitride and silicon oxynitride. By means of using such a structure mentioned above it is possible that the effective work function in the first gate lamination structure becomes less than 4.2 eV and the effective work function in the second gate lamination structure becomes more than 4.2 eV.

In the present invention, writing charge into the insulating film 11 including the trap layer is implemented through applying positive voltage to the first conductive body 9, the second conductive body 10 and the source drain region 3 such that the hot electron is injected. Also, reading out is implemented through applying positive voltage to the first conductive body 9, the second conductive body 10 and the source drain region 2, and through flowing the electric current from the source drain 3 to the source drain 2. In this time, under the condition that the insulating film 12 including the trap layer stores charge, the electric current for reading out reduces because the threshold value of the gate lamination structure 1 rises up.

The threshold value (VT) is expressed by the formula VT=VFB+2$\Phi$B+(4$\in$Si q Na $\Phi$B)^($\frac{1}{2}$)/Cox, when the difference between Fermi potential and true potential in the silicon substrate is defined as channel density is defined as Na, Dielectric constant of silicon is defined as $\in$Si and elementary charge is defined as q.

In the semiconductor device according to the present invention, since the effective work function of the second gate lamination structure is higher than that of the first gate lamination structure, the threshold value of the second gate lamination structure is higher even if the impurity densities are equal between the channel regions of the first gate lamination structure and the second gate lamination structure, and then it is possible to suppress the punch through electric current using the second gate lamination structure. Also, since the effective work function of the second gate lamination structure is more than 4.2 eV, the effective work function becomes higher, compared with the conventional structure in which a silicon oxide film for the second insulating film and silicon doped with n-type impurity for the second conductive body are used. Accordingly, it is possible to obtain a higher threshold value capable of suppressing the punch through electric current even when the impurity density in the channel region is low.

As shown in the present invention, when the impurity density in the channel region of the second gate lamination structure is low, the component of impurity scattering of the carrier (electron) which flows in the channel region of the second gate lamination structure is reduced, and then the mobility rises up. Accordingly, it is possible to obtain a higher transconductance even when the second insulating film is relatively thicker in the film thickness.

Furthermore, in the case that the effective work function of the second gate lamination structure is more than 4.6 eV, the impurity density in the channel region of the second gate lamination structure can be reduced, and then the effect of the mobility increase becomes large as much.

Figure 3:
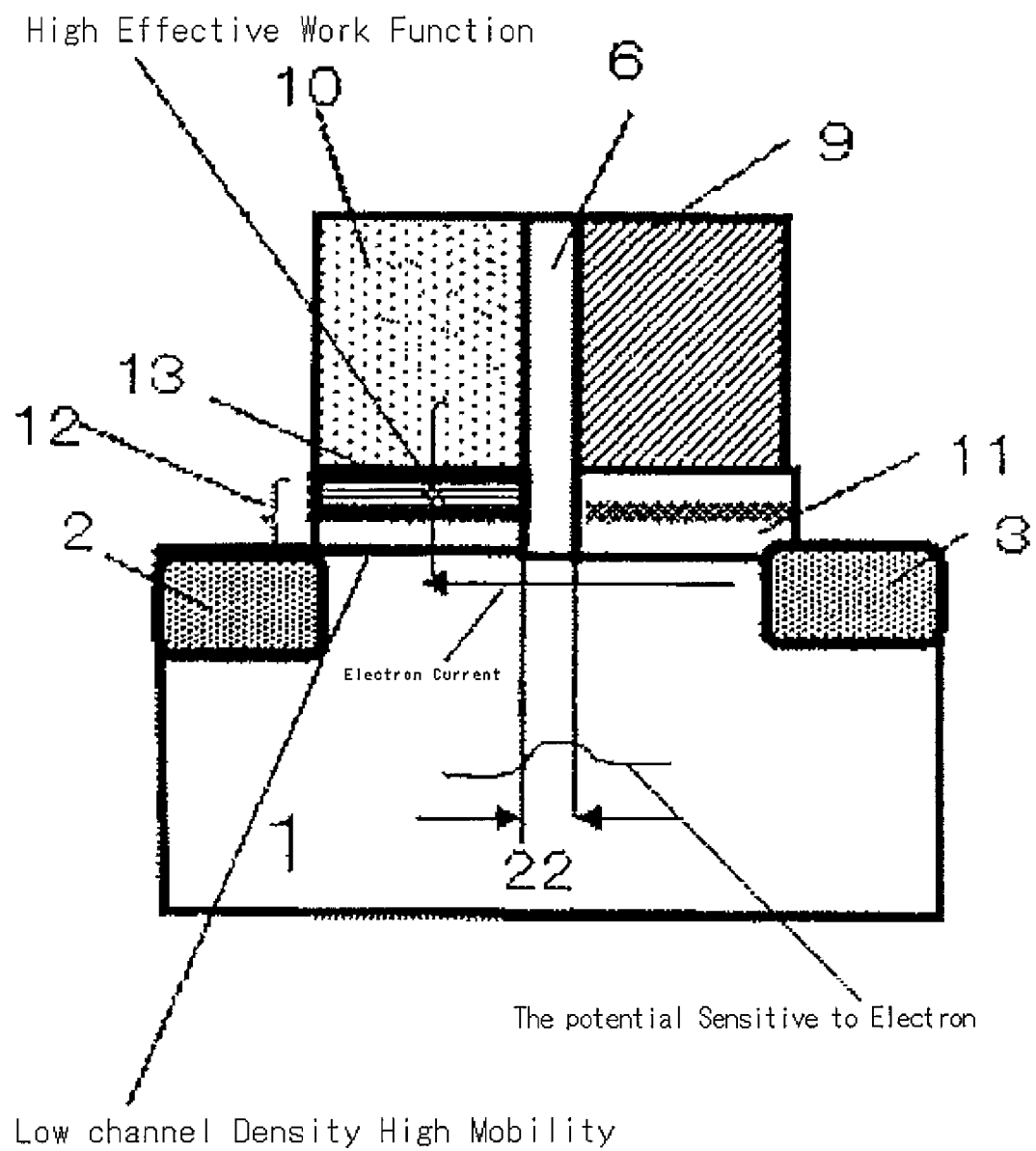
FIG. 3 is a view illustrated for explaining the effect of the present invention.

Also, as the secondary effect it is possible to reduce the potential barrier sensitive to electron due to the interelectrode gap occurred between the first gate lamination structure and the second gate lamination structure, as shown in FIG. 3, because the impurity density is reduced in the channel regions both of the first gate lamination structure and the second gate lamination structure. Therefore, it is possible to further increase the electric current for reading out.

According to the semiconductor device of the present invention, since it is not necessary to make the film thickness of the second insulating film thinner, it is preferable that the withstanding voltage of the second gate lamination structure is more than that of the first gate lamination structure. In other words, it is possible to obtain high reliability by way that the physical film thickness of the second insulating film 12 is more than that of the first insulating film 11.

Figure 4:
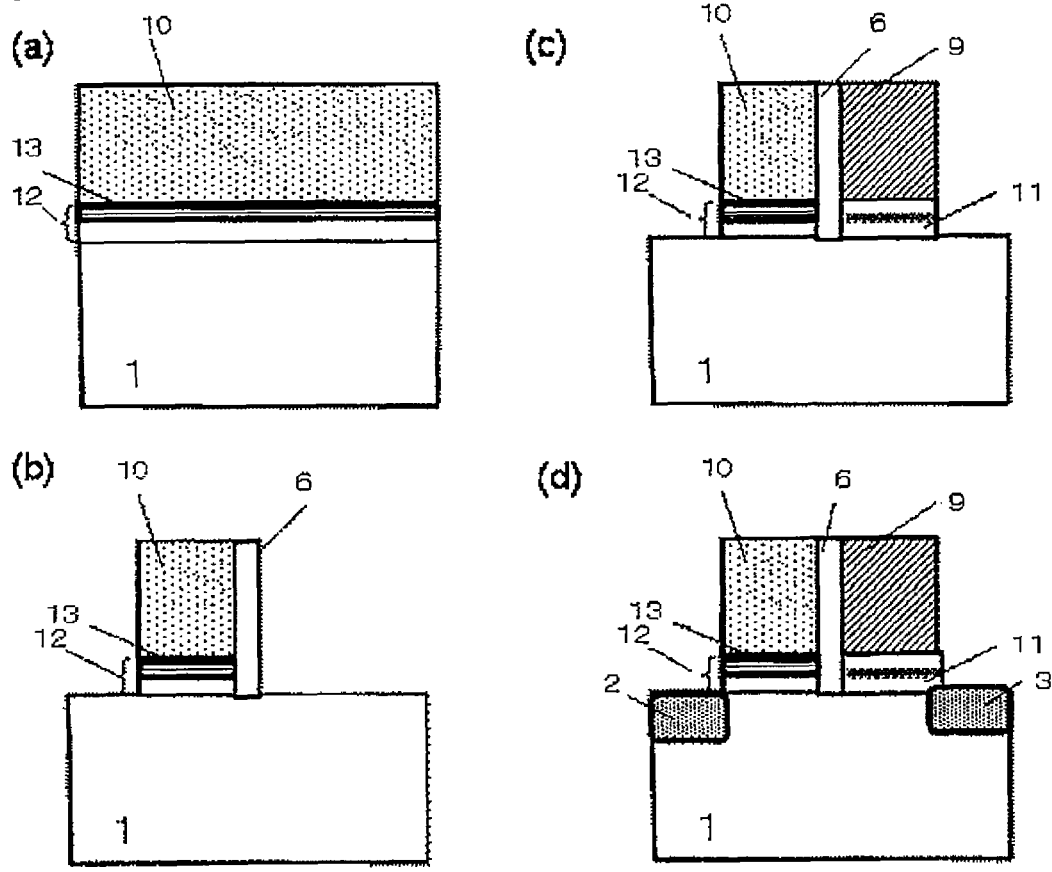
FIG. 4 is a view illustrated for explaining the manufacturing process of the first illustrative embodiment according to the present invention.

Also, it is possible to realize that the first transistor section and the second transistor section have a common electrode and then the whole area of the nonvolatile semiconductor chip including the periphery circuit can be reduced, because the whole withstanding voltage is not rate controlled by the withstanding voltage of the first transistor section. Next, a manufacturing process of the nonvolatile semiconductor memory device according to the present invention will be explained using FIG. 4.

At first, as shown in FIG. 4(a), there are deposited on the front face of the silicon substrate 1 the second insulating film 12 and the gate conductive body 10. At least in the top layer of the film 12 the silicon oxide 13 with its surface doped with Hf or Al is included. It is preferable to be silicon doped with the n-type impurity for the gate conductive body 10.

Then, as shown in FIG. 4(b), the second gate lamination structure is formed by dry etching the gate conductive body 10 and the second insulating film 12, using a resist mask already patterned. After dry etching, the patterned resist mask was removed. Further, the oxide film 6 is deposited by CVD (Chemical Vapor Deposition), and then etched back remaining the one side of the second gate lamination structure.

In the next, as shown in FIG. 4(c), the first gate lamination structure is formed by depositing a first gate insulating film 11 including a trap layer and a first gate conductive body 9, and then dry etching the first gate insulating film 11 including the trap layer and the first gate conductive body 9, using a resist mask already patterned. After dry etching back, the patterned resist mask was removed by wet etching. In addition, herein, it is preferable that the first gate insulating layer 11 is formed with a three layered structure made of a silicon oxide film, a silicon oxynitride film and a silicon oxide film, and that the first conductive body is silicon doped with the n-type impurity.

At last, source drain regions 2, 3 are formed so as to interleave the first gate lamination structure and the second gate lamination structure.

As explained above, it is possible to realize the nonvolatile semiconductor memory device according to the present invention with high withstanding voltage and high electric current for reading out.

Though in the present embodiment two abutting gate lamination structures are described, there may be added a third gate lamination structure formed on the other side of the second gate lamination structure, which may be used for control gates or other memory gates. In the case it is possible to control the respective gate lamination structure independently by interleaving an insulating film there between. On the contrary, by electrically connecting the three gate lamination structures the whole area of the nonvolatile semiconductor chip including the periphery circuit can be reduced.

<Second Illustrative Embodiment>

A second embodiment according to the present invention will be explained below using the drawings.

Figure 9:
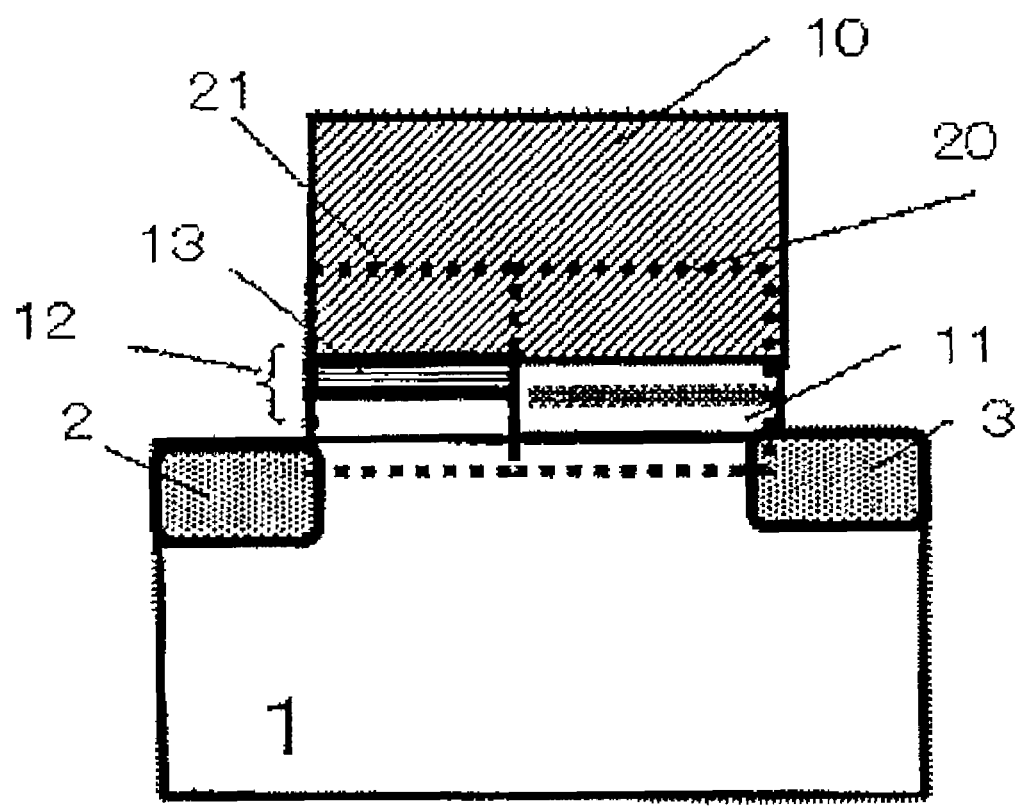
FIG. 9 is a sectional view of a second illustrative embodiment according to the present invention.

FIG. 9 is a sectional view of a second embodiment according to the present invention.

There is formed on the p-type semiconductor substrate 1 a gate lamination structure made of insulating films 11, 12 and 13, and a conductive body 10, the gate lamination structure consisting of a first region 20 including the trap layer and a second region 21 free of the trap layer and with an effective work function different from the first region 20. Also, source drain regions 2, 3 are formed so as to interleave the gate lamination structure. In the source drain region 3 near to the charge storage layer it is preferable that the diffusion layer is deep in order to raise up electron injection efficiency using the hot electron, and in the source drain region 2 it is preferable that the diffusion layer is shallow in order to suppress the short channel effect in the memory cell. Therefore, it is preferable that the depth of the diffusion layer in the source drain region 3 is deeper than that of the diffusion layer in the source drain region 2. Also, in case that the abutting memory cells are arranged in the symmetry with regards to the source drain region 2 or the source drain region 3 such that a plurality of the cells are arranged on the memory regions regularly, it is possible to use the abutting source drains in common with each other, thereby effecting downsizing of the chip.

The feature of the present invention is in that there are two regions in one conductive body and the effective work function of the second region is higher than that of the first region. Preferably, the effective work function is more than 4.2 eV, and more preferably more than 4.6 eV.

In addition, herein the effective work function indicates a value measured under the condition that respective regions are separate and independent gate. Furthermore, the effective work function of the first region corresponds to the value at the neutral state in which the first insulating film 11 does not store any charges.

In the present embodiment the conductive body 10 and the boundary region of the insulating film in the conductive body are formed with silicon doped with n-type impurity, and it is preferable to use silicon oxide 13 doped with metal elements at the upper layer on the insulating film 12 of the second region 21.

In detail, it is preferable that the insulating film 13 of the second region is made of a silicon oxide film or a silicon oxynitride film doped with Hf or Al and that the insulating film 11 of the first region comprises a first and a second layers seeing from the side of the channel region, in which the first layer is made of silicon oxide or silicon oxynitride and the second layer is made of either one of silicon nitride and silicon oxynitride.

Or, it is preferable that the insulating film 13 of the first region is a structure made of a silicon oxide film or silicon oxynitride film doped with Hf or Al, and the insulating film 11 of the second region comprises a structure with a first, a second and a third layers seeing from the side of the channel region, in which the first and the third layers are structures made of silicon oxide or silicon oxynitride and the second layer is made of either one of silicon nitride, silicon oxynitride, alumina, hafnium silicate, hafnium oxide silicate, aluminum silicate and aluminum oxide silicate.

By means of using such a structure mentioned above it is possible that the effective work function in the first region 20 becomes less than 4.2 eV and the effective work function in the second region 21 becomes more than 4.2 eV.

In the present invention, writing charge into the insulating film 11 including the trap layer is implemented through applying positive voltage to the conductive body 10 and the source drain region 3 such that the hot electron is injected. Also, reading out is implemented through applying positive voltage to the conductive body 10 and the source drain region 2, and through flowing the electric current from the source drain 3 to the source drain 2.

In this time, under the condition that the insulating film 12 including the trap layer stores charge, the electric current for reading out reduces because the threshold value of the gate lamination structure 1 rises up.

The threshold value (VT) is expressed by the formula $VT = VFB + 2\Phi B + (4 \in Si \, q \, Na \Phi B)^{(1/2)}/Cox$, when the difference between Fermi potential and true potential in the silicon substrate is defined as channel density is defined as Na, Dielectric constant of silicon is defined as cSi and elementary charge is defined as q.

In the semiconductor device according to the present invention, since the effective work function of the second region is higher than that of the first region, the threshold value of the second region is higher even if the impurity densities are equal between the channel regions of the first region 20 and the second region 21, and then it is possible to suppress the punch through electric current using the second region.

Also, since the effective work function of the second region is more than 4.2 eV, the effective work function becomes higher, compared with the conventional structure in which a silicon oxide film for the second insulating film and silicon doped with n-type impurity for the second conductive body are used. Accordingly, it is possible to obtain a higher threshold value capable of suppressing the punch through electric current even when the impurity density in the channel region is low.

As shown in the present invention, when the impurity density in the channel region of the second region is low, the component of impurity scattering of the carrier (electron) which flows in the channel region of the second region is reduced, and then the mobility rises up. Accordingly, it is possible to obtain a higher trans-conductance even when the second insulating film is relatively thicker in the film thickness.

Furthermore, in the case that the effective work function of the second region is more than 4.6 eV, the impurity density in the channel region of the second region can be reduced, and then the effect of the mobility increase becomes large as much.

Also, in case of using the present structure the higher electric current can be obtained for reading out, because there is no gap between the first region 20 and the second region 21 and therefore there is no gap between the gate lamination structures as shown in the conventional structure and the first embodiment.

According to the semiconductor device of the present invention, since it is not necessary to make the film thickness of the second insulating film 12 of the second region thinner, it is preferable that the withstanding voltage of the second region is more than that of the first gate lamination structure. In other words, it is possible to obtain high reliability by way that the physical film thickness of the insulating film 12 of the second region is more than that of the first insulating film 11 of the first region.

Figure 10:
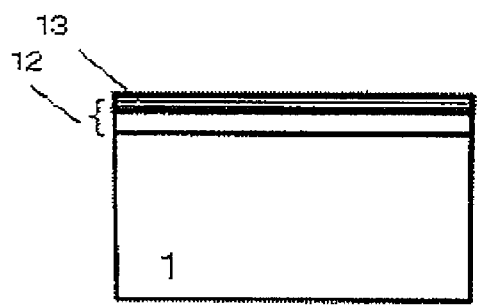
FIG. 10 is a view for explaining a process of the second illustrative embodiment according to the present invention.
Figure 10:
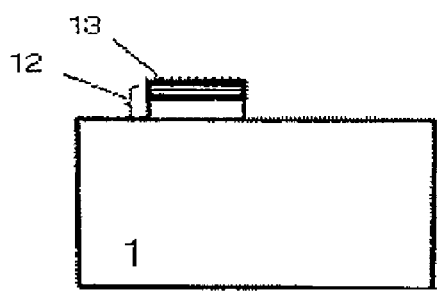
Figure 10:
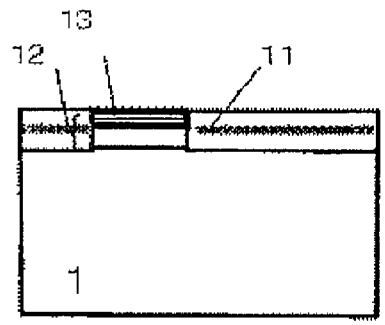
Figure 10:
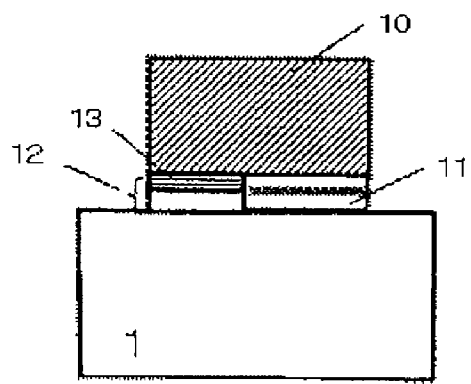
Figure 10:
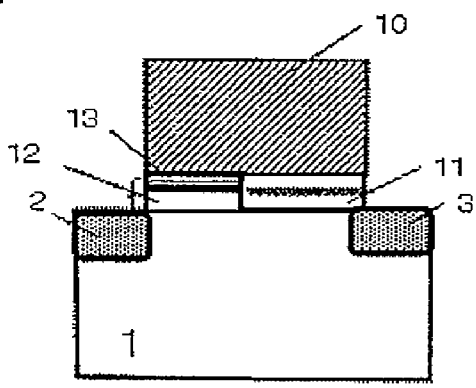

Next, a manufacturing process of the nonvolatile semiconductor memory device according to the present invention will be explained using FIG. 10.

At first, as shown in FIG. 10(a), there are deposited on the whole face of the silicon substrate 1 the insulating film 12 of the second region. At least in the top layer of the film 12 the silicon oxide layer13 with its surface doped with Hf or Al is included.

Then, as shown in FIG. 10(b), the silicon oxide layer 13 doped with Hf or Al and the insulating film 12 of the second region is etched and removed, using a resist mask already patterned. Fluorinated acid was used for etching.

After etching and removing, the patterned resist mask was removed.

In the next, as shown in FIG. 10(c), the insulating film 11 of the first region including a trap layer is deposited on the whole surface, and then the first insulating film 11 on the silicon oxide 13 doped with Hf or Al is etched and removed, using a resist mask already patterned.

In the etching process, dry etching conditions with high selectivity to the first insulating film 11 are utilized such that the silicon oxide 13 doped with Hf or Al is not damaged. After etching, the patterned resist mask was removed Herein, it is preferable that the first gate insulating film11 is formed with a three layered structure made of a silicon oxide film, a silicon oxynitride film and a silicon oxide film.

Then, as shown in FIG. 10(d), the conductive body 10 is deposited on the whole surface of the wafer, and then processed so as to be a gate shape, using the patterned resist mask and dry etching process. After etching the patterned mask is removed. Herein, it is preferable to be silicon doped with n-type impurity for the conductive body.

At last, as shown in FIG. 10(e), source drain regions 2 and 3 are formed so as to interleave the first gate lamination structure and the second gate lamination structure.

As explained above, it is possible to realize the nonvolatile semiconductor memory device according to the present invention with high withstanding voltage and high electric current for reading out.

Embodiment 1

Figure 5:
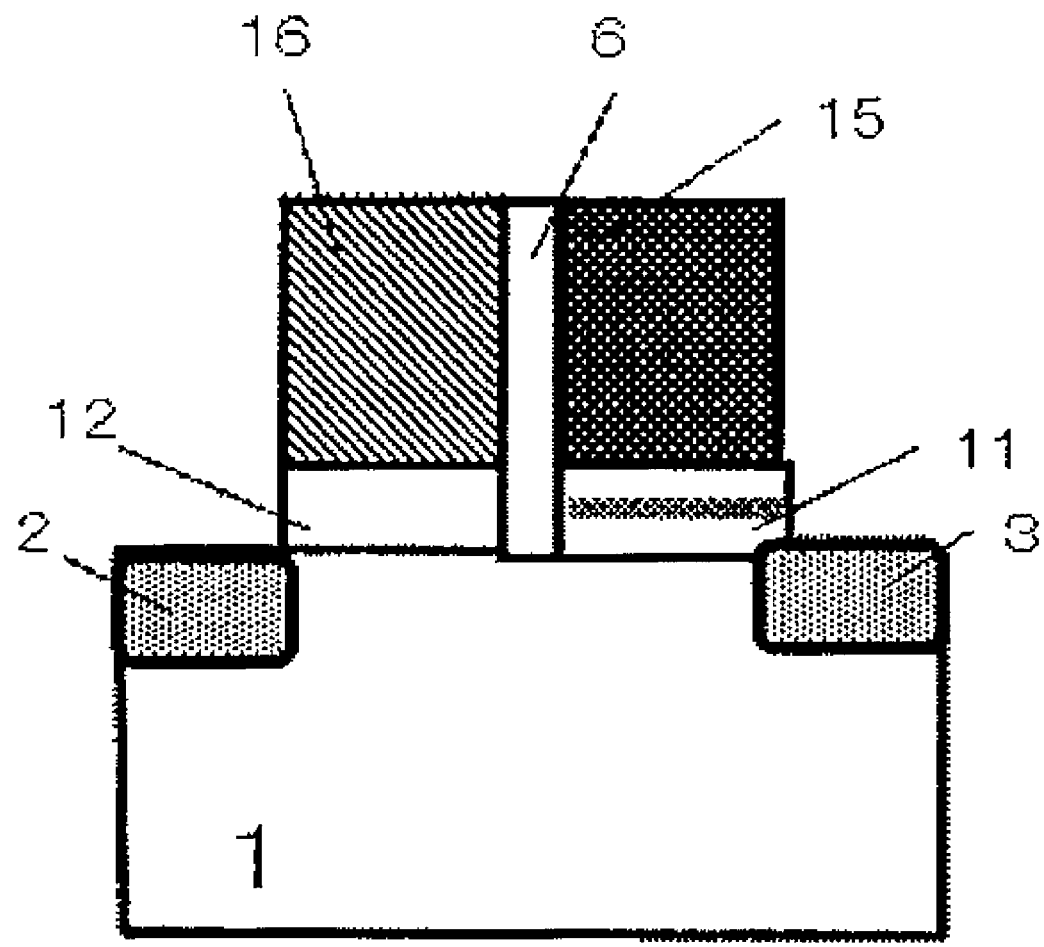
FIG. 5 is a sectional view of an embodiment 1.

FIG. 5 shows a first embodiment.

On a p-type semiconductor substrate 1 there are formed a first gate lamination structure and a second gate lamination structure. The first gate lamination structure comprises a first insulating film 11 including a trap layer and a first conductive body 15, and the second gate lamination structure comprises a second insulating film 12 free of a trap layer and a second conductive body 16. There are formed a source drain region 2 and a source drain region 3 interleaving the first gate lamination structure and the second gate lamination structure.

Also, there is formed an interelectrode insulating film 6 between the first gate lamination structure and the second gate lamination structure.

The feature of the present embodiment is in that silicon doped with the n-type impurity is used for the first conductive body 15, and silicon doped with the p-type impurity is used for the second conductive body 16.

It is preferable to form such a structure that at least the interface between the conductive body and the second insulating film 12 in the second conductive body 16 is made of silicon doped with the p-type impurity, and at least the interface between the conductive body and the first insulating film 11 in the first conductive body 15 is made of silicon doped with the n-type impurity.

Also, it is preferable to form such a structure that the second insulating film 12 is a film of silicon oxide or silicon oxynitride, and the first insulating film 11 comprises a first and a second layers seeing from the channel region side, the first layer being made of silicon oxide or silicon oxynitride, and the second layer being made of either one of silicon nitride and silicon oxynitride.

Or, it is preferable to form such a structure that at least the interface between the conductive body and the second insulating film 12 in the second conductive body 16 is made of silicon doped with the p-type impurity, and at least the interface between the conductive body and the first insulating film 11 in the first conductive body 15 is made of silicon doped with the n-type impurity.

Also, it is preferable to form such a structure that the second insulating film 12 is a film of silicon oxide or silicon oxynitride, and the first insulating film 11 comprises a first, a second and a third layers seeing from the channel region side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

By means of using such a structure mentioned above it is possible that the effective work function in the second gate lamination structure becomes higher than that of the effective work function in the first gate lamination structure, and then the effective work function in the second gate lamination structure can be reached at the value of more than 4.6 eV. Therefore, even in the case that the impurity density of the channel region in the second gate lamination structure is greatly reduced, it is possible to suppress the punch through such that the mobility is increased and the gap between the gate lamination structures is suppressed. The electric current for reading out is greatly increased due to those effects.

Embodiment 2

Figure 6:
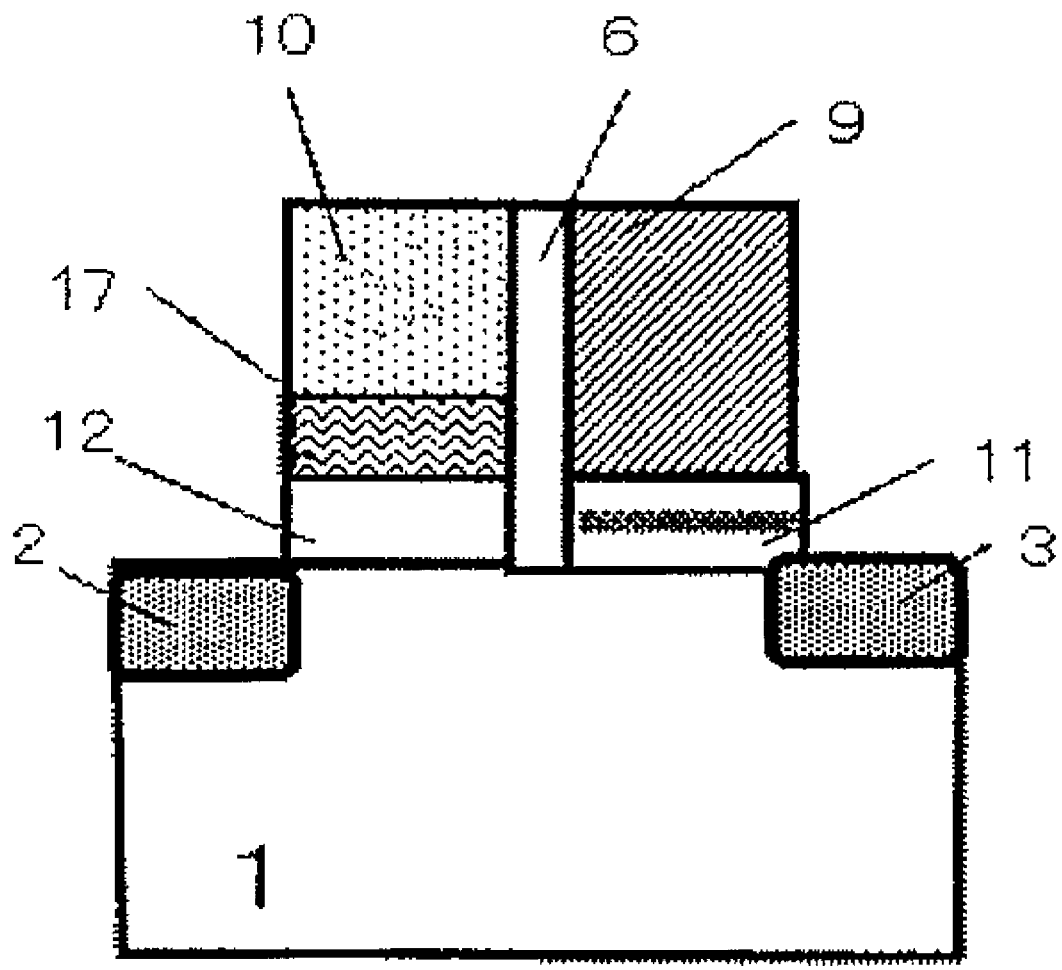
FIG. 6 is a sectional view of an embodiment 2.

FIG. 6 shows a second embodiment.

On a p-type semiconductor substrate 1 there are formed a first gate lamination structure and a second gate lamination structure. The first gate lamination structure comprises a first insulating film 11 including a trap layer and a first conductive body 9, and the second gate lamination structure comprises a second insulating film 12 with high dielectric constant free of a trap layer and a second conductive body 10. There are formed a source drain region 2 and a source drain region 3 interleaving the first gate lamination structure and the second gate lamination structure.

Also, there is formed an interelectrode insulating film 6 between the first gate lamination structure and the second gate lamination structure.

The feature of the present embodiment is in that silicon doped with the n-type impurity is used for the first conductive body 15 and the second conductive body 16, and insulating film with high dielectric constant is used for the second gate lamination structure.

In addition, it is preferable that the dielectric constant of the second insulating film 12 higher than that of the first insulating film 11, in other words, it is preferable that the withstanding voltage of the second insulating film 12 is higher than that of the first insulating film 11

In detail, it is preferable that the second insulating film 17 is a single layered film formed with either one of alumina, hafnium silicate, hafnium oxide silicate, aluminum silicate and aluminum oxide silicate, or a double layered structure in which a silicon oxide film or a silicon oxynitride film is formed as the substrate and either one of alumina, hafnium silicate, hafnium oxide silicate, aluminum silicate and aluminum oxide silicate is formed on the substrate.

Also, it is preferable that the first insulating film 11 comprises a first and a second layers seeing from the channel region side, the first layer being silicon oxide or silicon oxynitride and the second layer being either one of silicon oxide and silicon oxynitride.

Or, it is preferable to form such a structure that the second insulating film 17 is a single layered film formed with either one of alumina, hafnium silicate, hafnium oxide silicate, aluminum silicate and aluminum oxide silicate, or a double layered structure in which a silicon oxide film or a silicon oxynitride film is formed as the substrate and either one of alumina, hafnium silicate, hafnium oxide silicate, aluminum silicate and aluminum oxide silicate is formed on the substrate.

Also, it is preferable to form such a structure that the first insulating film 11 comprises a first, a second and a third layers seeing from the channel region side, the first and third layers being silicon oxide or silicon oxynitride and the second layer being either one of silicon oxide, silicon oxynitride, alumina, hafnium silicate, hafnium oxide silicate, aluminum silicate and aluminum oxide silicate.

By means of using such a structure mentioned above it is possible that the effective work function in the second gate lamination structure becomes higher than that of the effective work function in the first gate lamination structure, and then the effective work function in the second gate lamination structure can be reached at the value of more than 4.2 eV. Therefore, the impurity density of the channel region in the second gate lamination structure can be reduced, and as the result it is possible to increase the mobility and to suppress the gap between the gate lamination structures. As the result, the electric current for reading out can be increased.

In addition, since the insulating film with high dielectric constant is used for the second insulating film 17, it is possible to make the electrical film thickness thinner even if the film thickness or withstanding voltage is equal to the first insulating film 11, thereby effecting to further increase the electric current for reading out, compared with the embodiment 2.

Embodiment 3

Figure 7:
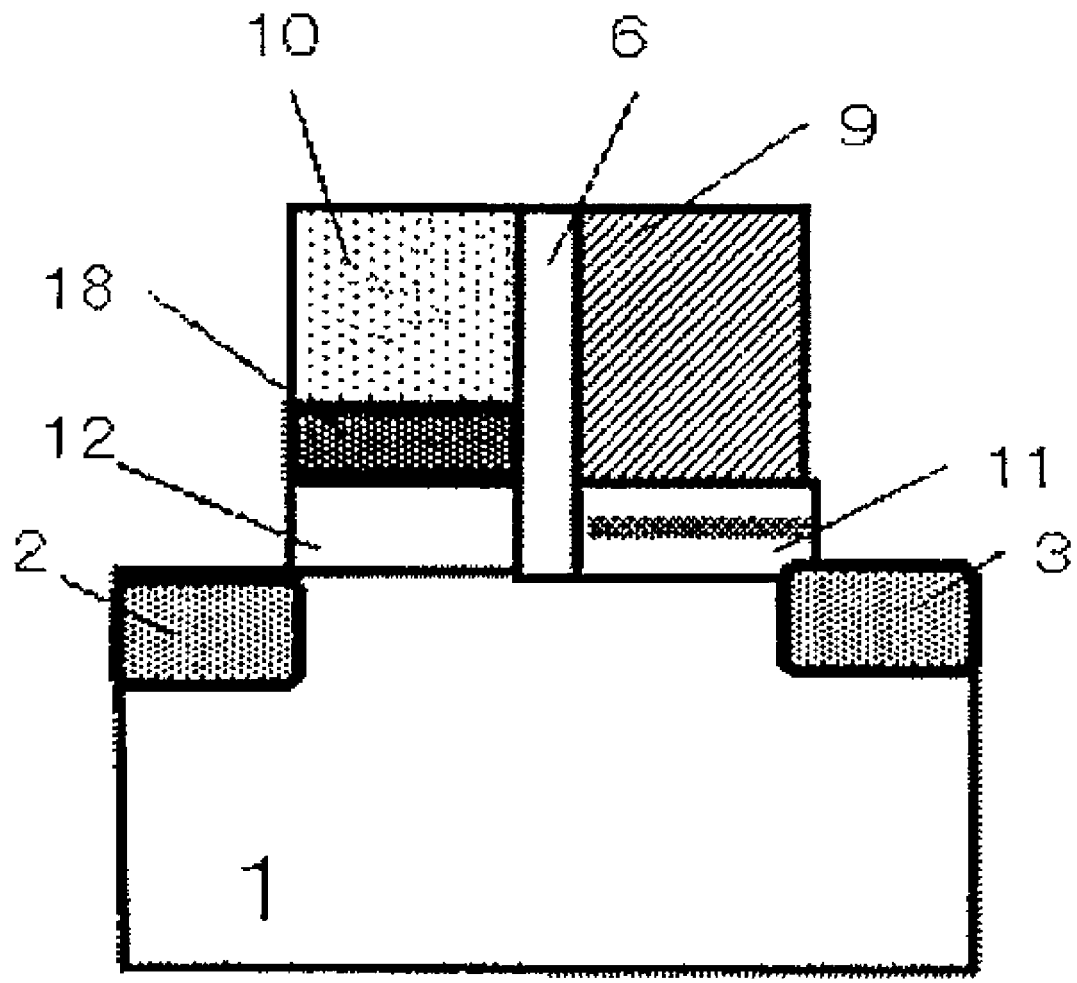
FIG. 7 is a sectional view of an embodiment 3.

FIG. 7 shows a third embodiment.

On a p-type semiconductor substrate 1 there are formed a first gate lamination structure and a second gate lamination structure. The first gate lamination structure comprises a first insulating film 11 including a trap layer and a first conductive body 9, and the second gate lamination structure comprises a second insulating film 12 free of a trap layer, a first metal or metallic silicide layer18 and a second conductive body 10. There are formed a source drain region 2 and a source drain region 3 interleaving the first gate lamination structure and the second gate lamination structure.

Also, there is formed an interelectrode insulating film 6 between the first gate lamination structure and the second gate lamination structure.

The feature of the present embodiment is in that the first metal or metallic silicide layer is interleaved between the second insulating film 12 and the conductive body 15 of the second conductive body.

In detail, it is preferable to form such a structure that at least the interface between the conductive body and the second insulating film 12 in the second conductive body10 interleaves a metal or metallic silicide layer 18, and at least the interface between the conductive body and the first insulating film 11 in the first conductive body 9 is made of silicon doped with the n-type impurity.

Also, it is preferable to form such a structure that the second insulating film 12 is a film of silicon oxide or silicon oxynitride, and the first insulating film 11 comprises a first and a second layers seeing from the channel region side, the first layer being made of silicon oxide or silicon oxynitride, and the second layer being made of either one of silicon nitride and silicon oxynitride.

Or, it is preferable to form such a structure that at least the interface between the conductive body and the second insulating film 12 in the second conductive body 10 interleaves a metal or metallic silicide layer 18, and at least the interface between the conductive body and the first insulating film 11 in the first conductive body 9 is made of silicon doped with the n-type impurity. Also, it is preferable to form such a structure that the second insulating film 12 is a film of silicon oxide or silicon oxynitride, and the first insulating film 11 comprises a first, a second and a third layers seeing from the channel region side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

Furthermore, it is preferable that such metal or metallic silicide is made of either one of nickel silicide, platinum silicide, nickel platinum silicide, iridium silicide, platinum germanium, nickel germanium, platinum germanium, molybdenum, a film of titanium nitride and ruthenium.

By means of using such a structure mentioned above it is possible that the effective work function in the second gate lamination structure becomes higher than that of the effective work function in the first gate lamination structure, and then the effective work function in the second gate lamination structure can be reached at the value of more than 4.6 eV. Therefore, the impurity density of the channel region in the second gate lamination structure can be reduced, and as the result it is possible to increase the mobility and to suppress the gap between the gate lamination structures. Accordingly, the electric current for reading out can be increased.

Also, since the electrode side is a metal or metallic silicide gate, there is no component of the gate depletion occurring when silicon doped with impurity is used. Namely, the electric current for reading out can be increased than that in embodiment 1 because the electrical film thickness can be made thinner as much as the level of the gate depletion.

Or, similar result can be obtained through forming such a structure that at least the interface between the second insulating film 12 and the conductive body in the second conductive body 9 is made of metal or metallic silicide, and at least the interface between the first insulating film 11 and the conductive body in the first conductive body 10 is made of silicon doped with the n-type impurity.

The second insulating film 12 may be doped with metal element.

In detail, at least in the interface between the second insulating film 12 and the conductive body, the second conductive body 10 is made of either one of nickel silicide, platinum silicide, nickel platinum silicide, iridium silicide, platinum germanium, nickel germanium, platinum germanium, molybdenum, a film of titanium nitride and ruthenium.

Also, similar result can be obtained through forming such a structure that the second insulating film 12 is a film of silicon oxide or silicon oxynitride which is doped with Hf or Al, and the first insulating film 11 comprises a first and a second layers seeing from the channel region side, the first layer being made of silicon oxide or silicon oxynitride, and the second layer being made of either one of silicon nitride and silicon oxynitride, or at least in the interface between the second insulating film 12 and the conductive body, the second conductive body 10 is made of either one of nickel silicide, platinum silicide, nickel platinum silicide, iridium silicide, platinum germanium, nickel germanium, platinum germanium, molybdenum, a film of titanium nitride and ruthenium.

Similar result can be obtained through forming such a structure that the second insulating film 12 is a film of silicon oxide or silicon oxynitride which is doped with Hf or Al, and the first insulating film 11 comprises a first, a second and a third layers seeing from the channel region side, the first and the third layers being made of silicon oxide or silicon oxynitride, and the second layer being made of either one of silicon nitride and silicon oxynitride, alumina, hafnium silicate, hafnium oxide silicate, aluminum silicate and aluminum oxide silicate.

Furthermore, since it is possible that dielectric constant of the second insulating film 12 is larger than that of the first insulating film 11 such that the withstanding voltage of the second insulating film becomes larger than that of the first insulating film and then the electrical film thickness becomes thinner, the electric current for reading out can be increased without deteriorating reliability.

In the case, it is preferable to form such a structure that at least in the interface between the second insulating film 12 and the conductive body, the second conductive body 10 is made of either one of nickel silicide, platinum silicide, nickel platinum silicide, iridium silicide, platinum germanium, nickel germanium, platinum germanium, molybdenum, a film of titanium nitride and ruthenium.

The second insulating film 12 is a single layered structure formed with either one of alumina, hafnium silicate, hafnium oxide silicate, aluminum silicate and aluminum oxide silicate, or a double layered structure in which a silicon oxide film or a silicon oxynitride film is formed so as to include a silicon oxide film or a silicon oxynitride as the boundary layer with the substrate. The first insulating film 11 comprises a first and a second layers seeing from the channel region side, the first layer being silicon oxide or silicon oxynitride and the second layer being made of either one of silicon oxide and silicon oxynitride.

Or, it is preferable to form such a structure that at least in the interface between the second insulating film 12 and the conductive body, the second conductive body 10 is made of either one of nickel silicide, platinum silicide, nickel platinum silicide, iridium silicide, platinum germanium, nickel germanium, platinum germanium, molybdenum, a film of titanium nitride and ruthenium.

The second insulating film 12 is a single layered structure formed with either one of alumina, hafnium silicate, hafnium oxide silicate, aluminum silicate and aluminum oxide silicate, or a double layered structure in which a silicon oxide film or a silicon oxynitride film is formed so as to include a silicon oxide film or a silicon oxynitride as the boundary layer with the substrate. The first insulating film 11 comprises a first, a second and a third layers seeing from the channel region side, the first and the third layers being made of silicon oxide or silicon oxynitride and the second layer being made of either one of silicon oxide and silicon oxynitride.

Embodiment 4

Figure 8:
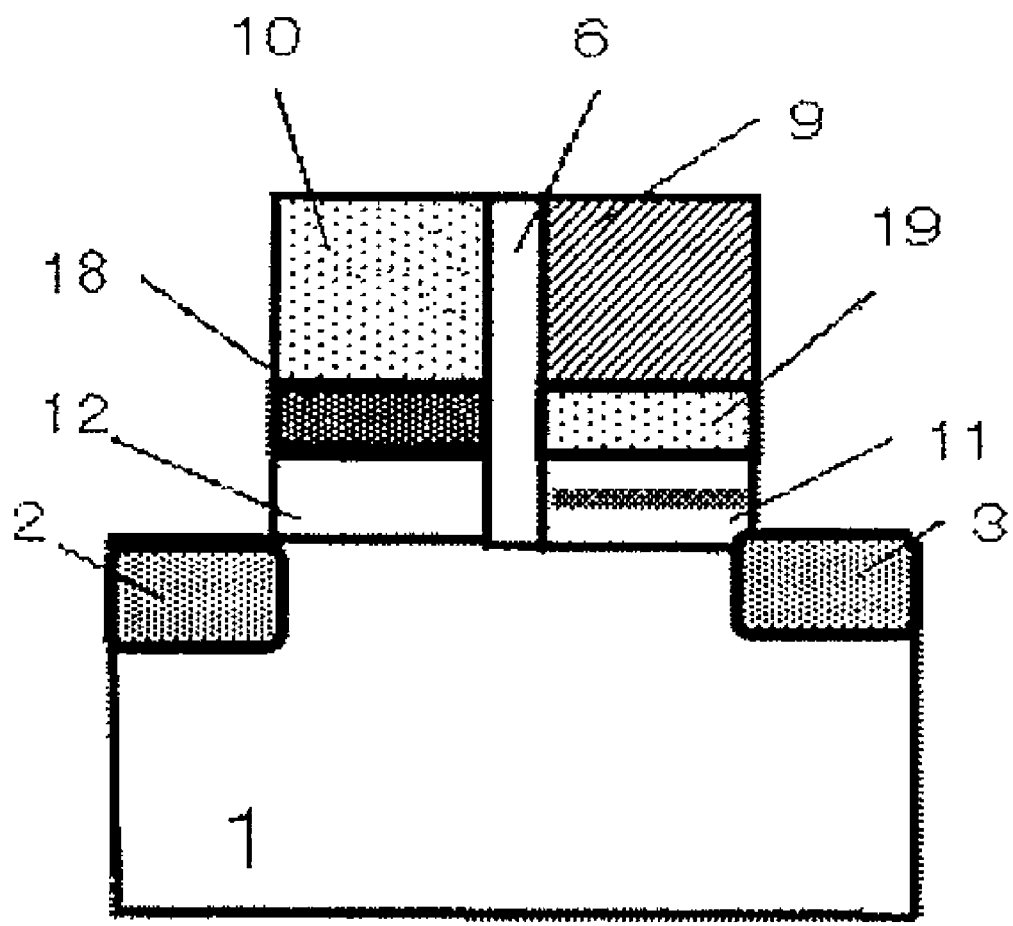
FIG. 8 is a sectional view of an embodiment 4.

FIG. 8 shows a fourth embodiment.

On a p-type semiconductor substrate 1 there are formed a first gate lamination structure and a second gate lamination structure. The first gate lamination structure comprises a first insulating film 11 including a trap layer, a second metal or metallic silicide 19 and a first conductive body 9, and the second gate lamination structure comprises a second insulating film 12 free of a trap layer, a first metal or metallic silicide layer18 and a second conductive body 10. There are formed a source drain region 2 and a source drain region 3 interleaving the first gate lamination structure and the second gate lamination structure.

Also, there is formed an interelectrode insulating film 6 between the first gate lamination structure and the second gate lamination structure.

The feature of the present embodiment is in that the interface between the first conductive body 9 and the first insulating firm 11, and the interface between the second conductive body 10 and the second insulating firm 12 interleave different kinds of metal or metallic silicide 18 and19.

In detail, it is preferable to form such a structure that at least the interfaces between the insulating film and the conductive body of the conductive bodies 9 and10 in the first and the second gate lamination structures are made of different kinds of metal or metallic silicide. The second insulating film 12 is a film made of silicon oxide or silicon oxynitride. The first insulating film 11 comprises a first and a second layers seeing from the channel region side, the first layer being made of silicon oxide or silicon oxynitride, and the second layer being made of either one of silicon nitride and silicon oxynitride.

Or, it is preferable to form such a structure that at least the interface between the insulating film and the conductive body of the conductive bodies 9 and10 in the first and the second gate lamination structures is made of different kinds of metal or metallic silicide. The second insulating film 12 is a film made of silicon oxide or silicon oxynitride. The first insulating film 11 comprises a first, a second and a third layers seeing from the channel region side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

In detail further, it is preferable to form such a structure that at least in the interface between the second insulating film 12 and the conductive body 10, the second conductive body 10 is made of either one of nickel silicide, platinum silicide, nickel platinum silicide, iridium silicide, platinum germanium, nickel germanium, platinum germanium, molybdenum, a film of titanium nitride and ruthenium. The first conductive body 9 at least in the interface between the second insulating film 11 and the conductive body 9 is made of either one of a film of zirconium nitride, tantalum, aluminum, zirconium and hafnium.

By means of using such a structure mentioned above it is possible that the effective work function in the second gate lamination structure becomes higher than that of the effective work function in the first gate lamination structure, and then the effective work function in the second gate lamination structure can be reached at the value of more than 4.6 eV, and the effective work function in the first gate lamination structure can be reduced less than 4.6 eV. Therefore, the impurity density of the channel region in the second gate lamination structure can be reduced, and as the result it is possible to increase the mobility and to suppress the gap between the gate lamination structures. Accordingly, the electric current for reading out can be increased.

Also, since the electrode sides in the first gate lamination structure and the second gate lamination structure are a metal or metallic silicide gate, there is no component of the gate depletion occurring when silicon doped with impurity is used. Namely, the electric current for reading out can be increased than that in embodiments 1 to 3 because the electrical film thickness can be made thinner.

Also, similar effects can be obtained even when the second insulating film 12 is doped with metal element since at least the interfaces between the insulating film and the conductive body of the conductive bodies 9 and10 in the first and the second gate lamination structures are made of different kinds of metal or metallic silicide 19 and 18.

In detail, similar effects can be obtained in such a structure that at least in the interface between the second insulating film 12 and the conductive body 10, the second conductive body 10 is made of either one of nickel silicide, platinum silicide, nickel platinum silicide, iridium silicide, platinum germanium, nickel germanium, platinum germanium, molybdenum, a film of titanium nitride and ruthenium, and the first conductive body 9 at least in the interface between the first insulating film 11 and the conductive body 9 is made of either one of a film of zirconium nitride, tantalum, aluminum, zirconium and hafnium, and the second insulating film 12 is a film of silicon oxide or silicon oxynitride which is doped with Hf or Al, and the first insulating film 11 comprises a first, a second and a third layers seeing from the channel region side, the first and the third layers being made of silicon oxide or silicon oxynitride, and the second layer being made of either one of silicon nitride and silicon oxynitride.

Or, at least in the interface between the second insulating film 12 and the conductive body 10, the second conductive body 10 is made of either one of nickel silicide, platinum silicide, nickel platinum silicide, iridium silicide, platinum germanium, nickel germanium, platinum germanium, molybdenum, a film of titanium nitride and ruthenium, and the first conductive body 9 at least in the interface between the first insulating film 11 and the conductive body 9 is made of either one of a film of zirconium nitride, tantalum, aluminum, zirconium and hafnium, and the second insulating film 12 is a film of silicon oxide or silicon oxynitride which is doped with Hf or Al, and the first insulating film 11 comprises a first, a second and a third layers or a first and a second layers, seeing from the channel region side, the first and the third layers being made of silicon oxide or silicon oxynitride, and the second layer being made of either one of silicon nitride and silicon oxynitride, alumina, hafnium silicate, hafnium oxide silicate, aluminum silicate and aluminum oxide silicate.

Furthermore, since it is possible that dielectric constant of the second insulating film 12 is larger than that of the first insulating film 11 such that the withstanding voltage of the second insulating film becomes larger than that of the first insulating film and then the electrical film thickness becomes thinner, the electric current for reading out can be increased without deteriorating reliability.

Namely, the highest electric current for reading out among the embodiments 1 to 4 can be obtained without loosing reliability by means of reduction in the impurity density at the channel, heightening of dielectric constant, and removal of the gate depletion layer.

In the case, it is preferable to form such a structure that the second conductive body 10 at least in the interface between the second insulating film 12 and the conductive body, is made of either one of nickel silicide, platinum silicide, nickel platinum silicide, iridium silicide, platinum germanium, nickel germanium, platinum germanium, molybdenum, a film of titanium nitride and ruthenium. The first conductive body 9 at least in the interface between the insulating film 11 and the conductive body 9 is made of either one of a film of zirconium nitride, tantalum, aluminum, zirconium and hafnium. The second insulating film 12 is a single layered structure formed with either one of alumina, hafnium silicate, hafnium oxide silicate, aluminum silicate and aluminum oxide silicate, or a double layered structure in which a silicon oxide film or a silicon oxynitride film is formed so as to include a silicon oxide film or a silicon oxynitride as the boundary layer with the substrate. The first insulating film 11 comprises a first, a second and a third layers seeing from the channel region side, the first and the third layers being made of silicon oxide or silicon oxynitride and the second layer being made of either one of silicon nitride, silicon oxynitride, alumina, hafnium silicate, hafnium oxide silicate, aluminum silicate and aluminum oxide silicate.

Or, it is preferable to form such a structure that the second conductive body 10 at least in the interface between the second insulating film 12 and the conductive body 10 is made of either one of nickel silicide, platinum silicide, nickel platinum silicide, iridium silicide, platinum germanium, nickel germanium, platinum germanium, molybdenum, a film of titanium nitride and ruthenium. The first conductive body 9 at least in the interface between the insulating film 11 and the conductive body 9 is made of either one of a film of zirconium nitride, tantalum, aluminum, zirconium and hafnium. The second insulating film 12 is a single layered structure formed with either one of alumina, hafnium silicate, hafnium oxide silicate, aluminum silicate and aluminum oxide silicate, or a double layered structure in which a silicon oxide film or a silicon oxynitride film is formed so as to include a silicon oxide film or a silicon oxynitride as the boundary layer with the substrate. The first insulating film 11 comprises a first and a second layers seeing from the channel region side, the first layer being made of silicon oxide or silicon oxynitride and the second layer being made of either one of silicon nitride and silicon oxynitride.

Embodiment 5

Figure 11:
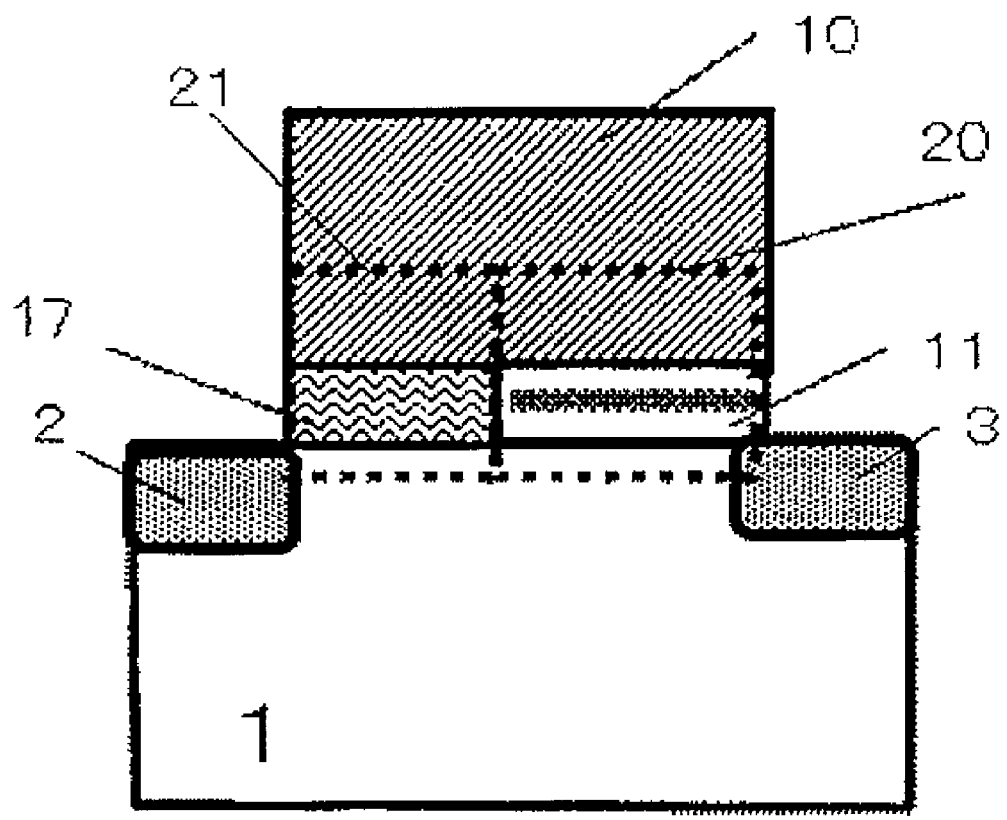
FIG. 11 is a sectional view of embodiment 5.

FIG. 11 shows a fifth embodiment as the second embodiment.

On a p-type semiconductor substrate 1 there is formed a gate lamination structure which comprises insulating film 11 and 17, and a conductive body 10. There are provided on the gate lamination structure a first region 20 including a trap layer and a second region 21 free of a trap layer and having an effective work function different from the first region.

Also, there are formed a source drain region 2 and a source drain region 3 interleaving the gate lamination structure.

The feature of the present embodiment is in that silicon doped with n-type impurity is used for the conductive body 10, and an insulating film 17 with high dielectric constant is used for the second region.

In addition, it is preferable that the dielectric constant in the insulating film 17 of the second region is higher than that in the insulating film 11 of the first region, that is, the withstanding voltage in the insulating film 17 of the second region is higher than that in the insulating film 11 of the first region.

In detail, it is preferable to form such a structure that the insulating film 17 of the second region is a single layered film formed with either one of alumina, hafnium silicate, hafnium oxide silicate, aluminum silicate and aluminum oxide silicate, or a double layered structure in which a silicon oxide film or a silicon oxynitride film is formed as the substrate, and on which a film of either one of alumina, hafnium silicate, hafnium oxide silicate, aluminum silicate and aluminum oxide silicate is formed.

The first insulating film 11 of the first region comprises a first, a second and a third layers seeing from the channel region side, the first and the third layers being made of silicon oxide or silicon oxynitride and the second layer being made of either one of silicon nitride, silicon oxynitride, alumina, hafnium silicate, hafnium oxide silicate, aluminum silicate and aluminum oxide silicate.

Or, it is preferable to form such a structure that the insulating film 17 of the second region is a single layered film formed with either one of alumina, hafnium silicate, hafnium oxide silicate, aluminum silicate and aluminum oxide silicate, or a double layered structure in which a silicon oxide film or a silicon oxynitride film is formed as the substrate, and on which a film of either one of alumina, hafnium silicate, hafnium oxide silicate, aluminum silicate and aluminum oxide silicate is formed.

The first insulating film 11 of the first region comprises a first, a second and a third layers seeing from the channel region side, the first and the third layers being made of silicon oxide or silicon oxynitride and the second layer being made of either one of silicon oxide and silicon oxynitride.

By means of using such a structure mentioned above it is possible that the effective work function in the second region becomes higher than that of the effective work function in the first region, and then the effective work function in the second region can be reached at the value of more than 4.2 eV. Therefore, the impurity density of the channel region in the second region can be reduced, and as the result it is possible to increase the mobility. Accordingly, the electric current for reading out can be increased.

Also, since the insulating film with high dielectric constant is used for the insulating film 17 of the second region, it is possible to make the electrical film thickness thinner even when the film thickness or withstanding voltage is equal to that in the first insulating film 11, whereby the electric current for reading out can be increased than that in the second embodiment.

Embodiment 6

Figure 12:
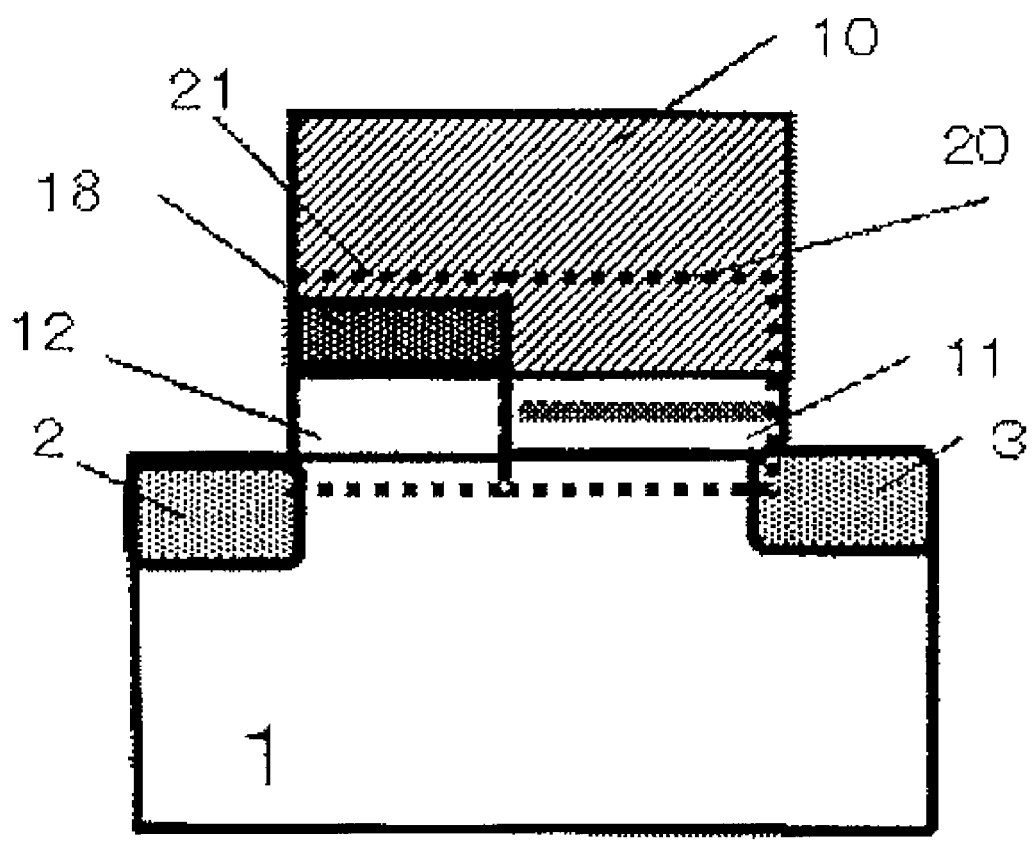
FIG. 12 is a sectional view of embodiment 6.

FIG. 12 shows a sixth embodiment as the second embodiment.

On a p-type semiconductor substrate 1 there is formed a gate lamination structure which comprises metal or metallic silicide 18 formed on the boundary surfaces between insulating films 11 and 17, and a conductive body 10, and between an insulating film 12 and a conductive body 10. There are provided on the gate lamination structure a first region 20 including a trap layer and a second region 21 free of a trap layer and having an effective work function different from the first region. Also, there are formed a source drain region 2 and a source drain region 3 interleaving the gate lamination structure.

The feature of the present embodiment is in that the first metal or metallic silicide 18 is interleaved between the second insulating film 12 and the conductive body 10.

In detail, it is preferable to form such a structure that the second region 21 of the conductive body 10 at least near the interface between the insulating film and the conductive body is made of metal or metallic silicide, and the first region 20 of the conductive body 10 at least near the interface between the insulating film and the conductive body is made of silicon doped with the n-type impurity. The insulating film 12 of the second region is made of silicon oxide or silicon oxynitride. The insulating film 11 of the first region comprises a first and a second layers seeing from channel side, the first layer being made of silicon oxide or silicon oxynitride, and the second layer being made of either one of silicon oxide and silicon oxynitride.

Or, it is preferable to form such a structure that the second region 21 of the conductive body 10 at least near the interface between the insulating film and the conductive body is made of metal or metallic silicide, and the first region 20 of the conductive body 10 at least near the interface between the insulating film and the conductive body is made of silicon doped with the n-type impurity. The insulating film 12 of the second region is made of silicon oxide or silicon oxynitride. The insulating film 11 of the first region comprises a first, a second and a third layers seeing from channel side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

Furthermore, such metal or metallic silicide 18 is made of either one of nickel silicide, platinum silicide, nickel platinum silicide, iridium silicide, platinum germanium, nickel germanium, platinum germanium, molybdenum, a film of titanium nitride and ruthenium.

By means of using such a structure mentioned above it is possible that the effective work function in the second region 21 becomes higher than that of the effective work function in the first region 20, and then the effective work function in the second region 21 can be reached at the value of more than 4.6 eV. Therefore, the impurity density of the channel region in the second region 21 can be reduced, and as the result it is possible to increase the mobility. Accordingly, the electric current for reading out can be increased.

Also, since the electrode sides are a metal or metallic silicide gate, there is no component of the gate depletion occurring when silicon doped with impurity is used. Namely, the electric current for reading out can be increased than that in embodiment 5 as much as the electrical film thickness can be made thinner.

Also, similar effects can be obtained through forming such a structure that the second region 21 of the conductive body 10 at least in the interface between the insulating film and the conductive body is made of metal or metallic silicide, and the first region 20 of the conductive body 10 at least near the interface between the insulating film and the conductive body is made of silicon doped with the n-type impurity. The insulating film 12 of the second region may be doped with metal element.

In detail, the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium.

The insulating film 12 of the second region is made of a film of silicon oxide or silicon oxynitride doped with Hf or Al.

The insulating film 11 of the first region comprises a first and a second layers seeing from channel region side, the first layer being made of silicon oxide or silicon oxynitride, and the second layer being made of either one of silicon oxide and silicon oxynitride.

Furthermore, since it is possible that dielectric constant of the insulating film 12 of the second region is larger than that of the insulating film 11 of the first region such that the withstanding voltage of the insulating film 12 of the second region becomes larger than that of the insulating film 11 of the first region and then the electrical film of the insulating film 12 of the second region thickness becomes thinner, the electric current for reading out can be increased without deteriorating reliability.

In the case, it is preferable to form such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium. The insulating film 12 of the second region is made of a film of silicon oxide or silicon oxynitride doped with Hf or Al.

The insulating film 11 of the first region comprises a first, a second and a third layers seeing from channel side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

Or, it is preferable to form such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium. The insulating film 12 of the second region is made of a film of silicon oxide or silicon oxynitride doped with Hf or Al.

The insulating film 11 of the first region comprises a first and a second layers seeing from channel side, the first layer being made of silicon oxide or silicon oxynitride, and the second layer being made of either one of silicon nitride and silicon oxynitride.

Or, it is preferable to form such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium. The insulating film 12 of the second region is a single layered film formed with either one of alumina, hafnium silicate, hafnium oxide silicate, aluminum silicate and aluminum oxide silicate, or a two layered film formed with a silicon oxide film or a silicon oxynitride as the boundary layer with the substrate, on which either one of alumina, hafnium silicate, hafnium oxide silicate, aluminum silicate and aluminum oxide silicate is formed. The insulating film 11 of the first region comprises a first and a second layers seeing from the channel region side, the first layer being made of silicon oxide or silicon oxynitride and the second layer being made of either one of silicon nitride, silicon oxynitride, alumina, hafnium silicate, hafnium oxide silicate, aluminum silicate and aluminum oxide silicate.

Or, it is preferable to form such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium. The insulating film 12 of the second region is a single layered film formed with either one of alumina, hafnium silicate, hafnium oxide silicate, aluminum silicate and aluminum oxide silicate, or a two layered film formed with a silicon oxide film or a silicon oxynitride as the boundary layer with the substrate, on which either one of alumina, hafnium silicate, hafnium oxide silicate, aluminum silicate and aluminum oxide silicate is formed. The insulating film 11 of the first region comprises a first, a second and a third layers seeing from the channel region side, the first and the third layers being made of silicon oxide or silicon oxynitride and the second layer being made of either one of silicon nitride, silicon oxynitride, alumina, hafnium silicate, hafnium oxide silicate, aluminum silicate and aluminum oxide silicate.

Embodiment 7

Figure 13:
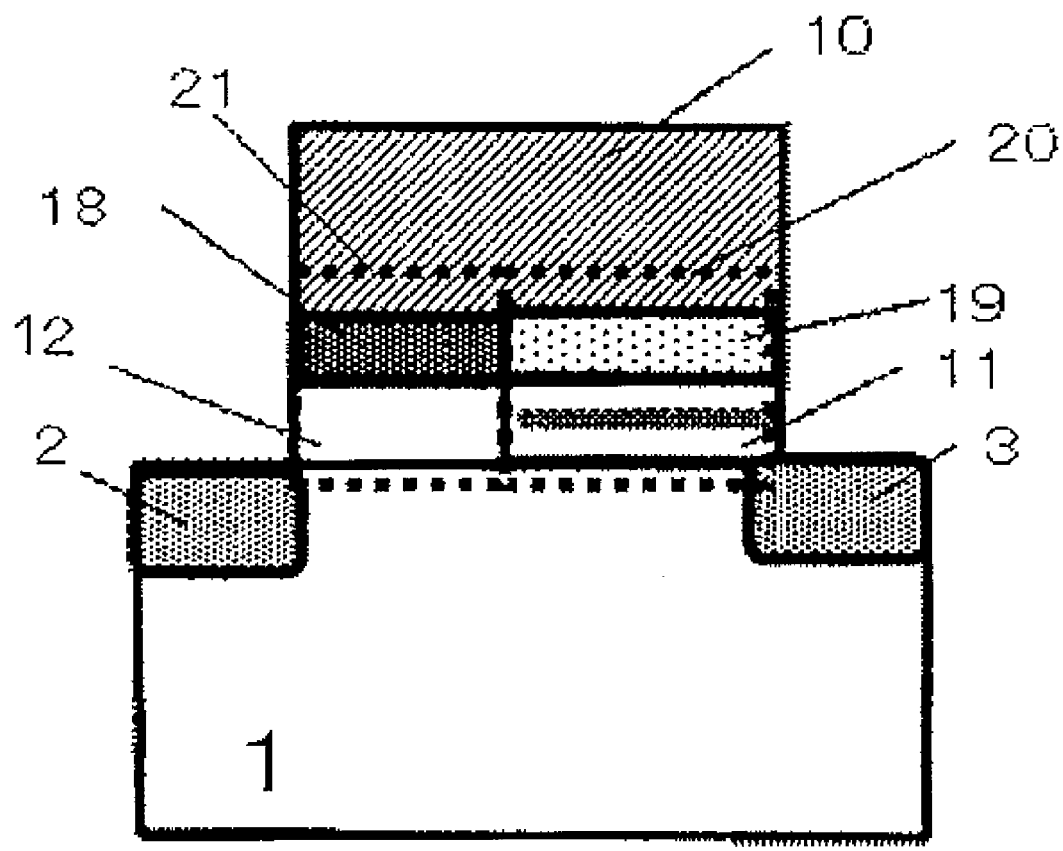
FIG. 13 is a sectional view of embodiment 7.

FIG. 13 shows a seventh embodiment as the second embodiment.

On a p-type semiconductor substrate 1 there is formed a gate lamination structure which comprises metal or metallic silicide 18 and 19 formed on the boundary surfaces between insulating films 11 and 12, and a conductive body 10, and between an insulating film 11 and 12, and a conductive body 10. There are provided on the gate lamination structure a first region 20 including a trap layer and a second region 21 free of a trap layer and having an effective work function different from the first region.

Also, there are formed a source drain region 2 and a source drain region 3 interleaving the gate lamination structure.

The feature of the present embodiment is in that the different metal or metallic silicide 18 and 19 are interleaved in the interface between the conductive body 10 and the insulating film 11 of the first region, and in the interface between the conductive body 10 and the insulating film 12 of the second region.

In detail, it is preferable to form such a structure that the interface between the insulating film and the conductive body of the first region 20 and the second region 21 of the conductive body 10 are made of different kinds of metal or metallic silicide. The insulating film 12 of the second region is a film of silicon oxide or silicon oxynitride, and the insulating film 11 of the first region comprises a first and a second layers seeing from the channel side, the first layer being made of silicon oxide or silicon oxynitride, and the second layer being made of either one of silicon oxide or silicon oxynitride.

Or, it is preferable to form such a structure that at least the interface between the insulating film and the conductive body of the first region 20 and the second region 21 of the conductive body 10 are made of different kinds of metal or metallic silicide. The insulating film 12 of the second region is a film of silicon oxide or silicon oxynitride, and the insulating film 11 of the first region comprises a first, a second and a third layers seeing from the channel side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

Further in detail, it is preferable to form such a structure that at least the interface between the insulating film and the conductive body in the second region 21 of the conductive body 10 is made of either one of nickel silicide, platinum silicide, nickel platinum silicide, iridium silicide, platinum germanium, nickel germanium, platinum germanium, molybdenum, a film of titanium nitride and ruthenium. At least the interface between the insulating film and the conductive body in the first region 20 of the conductive body 10 is made of either one of a film of zirconium nitride, tantalum, aluminum, zirconium and hafnium.

By means of using such a structure mentioned above it is possible that the effective work function in the second region 21 becomes higher than that of the effective work function in the first region 20, and then the effective work function in the second region 21 can be reached at the value of more than 4.6 eV, and also the effective work function in the first region 20 can be reduced less than 4.6 eV. Therefore, the impurity density of the channel region in the second region 21 can be reduced, and as the result it is possible to increase the mobility. Accordingly, the electric current for reading out can be increased.

Also, since the interface between the electrodes and the insulating film are made of the metal or metallic silicide gate, there is no component of the gate depletion occurring when silicon doped with impurity is used. Namely, the electric current for reading out can be increased than that in embodiments 5 and 6 as much as the electrical film thickness can be made thinner.

Furthermore, similar effects can be obtained even in the case that at least the interface between the insulating film and the conductive body of the first region 20 and the second region 21 of the conductive body 10 is made of different kinds of metal or metallic silicide 18 and 19, and that the insulating film 12 of the second region is doped with metal element.

In detail, similar effects can be obtained through forming such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium.

The first region 20 of the conductive body 10 at least in the interface between the insulating film and the conductive body is made of either one of a film of zirconium nitride, tantalum, aluminum, zirconium and hafnium.

The insulating film 12 of the second region is made of a film of silicon oxide or silicon oxynitride doped with Hf or Al.

The insulating film 11 of the first region comprises a first and a second layers seeing from channel region side, the first layer being made of silicon oxide or silicon oxynitride, and the second layer being made of either one of silicon oxide and silicon oxynitride.

Or, similar effects can be obtained through forming such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium.

The first region 20 of the conductive body 10 at least in the interface between the insulating film and the conductive body is made of either one of a film of zirconium nitride, tantalum, aluminum, zirconium and hafnium.

The insulating film 12 of the second region is made of a film of silicon oxide or silicon oxynitride doped with Hf or Al.

The insulating film 11 of the first region comprises a first, a second and a third layers seeing from channel region side, the first and the third layers being made of silicon oxide or silicon oxynitride, and the second layer being made of either one of silicon nitride, silicon oxynitride, alumina, hafnium silicate, hafnium oxide silicate, aluminum silicate and aluminum oxide silicate.

Furthermore, since it is possible that dielectric constant of the insulating film 12 of the second region is larger than that of the insulating film 11 of the first region such that the withstanding voltage of the insulating film of the second region becomes larger than that of the insulating film of the first region and then the electrical film thickness becomes thinner, the electric current for reading out can be increased without deteriorating reliability.

Namely, the highest electric current for reading out among the embodiments 1 and 2, and embodiment 1 to 7 can be obtained without loosing reliability by means of reduction in the impurity density at the channel, gapless, heightening of dielectric constant, and removal of the gate depletion layer.

In the case, it is preferable to form such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium. The first region 20 of the conductive body 10 at least in the interface between the insulating film and the conductive body is made of either one of a film of zirconium nitride, tantalum, aluminum, zirconium and hafnium.

The insulating film 12 of the second region is a single layered film formed with either one of alumina, hafnium silicate, hafnium oxide silicate, aluminum silicate and aluminum oxide silicate, or a double layered structure formed with a silicon oxide film or a silicon oxynitride as the boundary layer with the substrate, on which either one of alumina, hafnium silicate, hafnium oxide silicate, aluminum silicate and aluminum oxide silicate is formed. The insulating film 11 of the first region comprises a first and a second layers seeing from the channel region side, the first layer being made of silicon oxide or silicon oxynitride and the second layer being made of either one of silicon nitride, silicon oxynitride, alumina, hafnium silicate, hafnium oxide silicate, aluminum silicate and aluminum oxide silicate.

Or, it is preferable to form such a structure that the second region 21 of the conductive body 10 at least in the interface between the insulating film and the conductive body is made of either one of nickel silicide, platinum silicide, nickel platinum silicide, iridium silicide, platinum germanium, nickel germanium, platinum germanium, molybdenum, a film of titanium nitride and ruthenium. The first region 20 of the conductive body 10 at least in the interface between the insulating film and the conductive body is made of either one of a film of zirconium nitride, tantalum, aluminum, zirconium and hafnium.

The insulating film 12 of the second region is a single layered film formed with either one of alumina, hafnium silicate, hafnium oxide silicate, aluminum silicate and aluminum oxide silicate, or a double layered structure formed with a silicon oxide film or a silicon oxynitride as the boundary layer with the substrate, on which either one of alumina, hafnium silicate, hafnium oxide silicate, aluminum silicate and aluminum oxide silicate is formed. The insulating film 11 of the first region comprises a first, a second and a third layers seeing from the channel region side, the first and the third layers being made of silicon oxide or silicon oxynitride and the second layer being made of either one of silicon nitride, silicon oxynitride, alumina, hafnium silicate, hafnium oxide silicate, aluminum silicate and aluminum oxide silicate.

The present invention is applicable to all sorts of semiconductor device and manufacturing technology thereof and not limited in possibilities of the applications, as long as such applications relate to a semiconductor device and a manufacturing technology thereof, and more specifically relates to an effective technology applied to the semiconductor device with a rewritable and nonvolatile memory.

The present invention has been explained herewith respect to several preferable illustrative embodiments and embodiments. However, it should be interpreted that those illustrative embodiments and embodiments are examples for merely explaining the invention, and not for limiting the scope of the invention. It is apparent that a person ordinary skill in the art could easily implement many modifications and substitutions equivalent to the present invention after knowing the present invention, and that those modifications and substitutions are within the scope of the present invention described in the following claims.

What is claimed is:

1. A semiconductor device provided with at least a first gate lamination structure and a second gate lamination structure wherein the first gate lamination structure comprises
a first channel region formed on a semiconductor substrate,
a first insulating film including a charge storage layer and
a first conductive body,
the second gate lamination structure comprises
a second channel region formed abutting with the first gate lamination structure
a second insulating film free of a charge storage layer and
a second conductive body,
effective work function of the second gate lamination structure is higher than the effective work function of the first gate lamination structure, wherein
the first gate lamination structure and the second gate lamination structure are connected.

2. A semiconductor device provided with at least a first gate lamination structure and a second gate lamination structure wherein the first gate lamination structure comprises
a first channel region formed on a semiconductor substrate,
a first insulating film including a charge storage layer and
a first conductive body,
the second gate lamination structure comprises
a second channel region formed abutting with the first gate lamination structure
a second insulating film free of a charge storage layer and
a second conductive body,
effective work function of the second gate lamination structure is higher than the effective work function of the first gate lamination structure, wherein
the device is formed do as to interleave a first gate lamination structure and a second gate lamination structure, or the gate lamination structure, and
the device is provided with a first diffusion layer of a second conductive type impurity which contacts with a first region in the first gate lamination structure or the gate lamination structure and a second diffusion layer of a second conductive type impurity which contacts with a second region in the second gate lamination structure or the gate lamination structure.

3. The semiconductor device according to claim 2, wherein a junction depth of the first diffusion layer of a second conductive type impurity is deeper, compared with a junction depth of the second diffusion layer of a second conductive type impurity.

* * * * *